United States Patent
Nomiya

(10) Patent No.: US 11,239,821 B2
(45) Date of Patent: Feb. 1, 2022

(54) ELECTRONIC COMPONENT DEVICE

(71) Applicant: Murata Manufacturing Co., Ltd., Nagaokakyo (JP)

(72) Inventor: Masato Nomiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 16/704,291

(22) Filed: Dec. 5, 2019

(65) Prior Publication Data

US 2020/0112297 A1 Apr. 9, 2020

Related U.S. Application Data

(63) Continuation of application No. PCT/JP2018/020102, filed on May 25, 2018.

(30) Foreign Application Priority Data

Jun. 23, 2017 (JP) .............................. JP2017-123074

(51) Int. Cl.
*H03H 9/05* (2006.01)
*H03H 9/08* (2006.01)
(Continued)

(52) U.S. Cl.
CPC ............ *H03H 9/0576* (2013.01); *H03H 9/08* (2013.01); *H03H 9/1085* (2013.01); *H03H 9/64* (2013.01); *H03H 9/725* (2013.01)

(58) Field of Classification Search
CPC ...... H03H 9/0576; H03H 9/08; H03H 9/1085; H03H 9/64; H03H 9/725; H03H 9/0542;
(Continued)

(56) References Cited

U.S. PATENT DOCUMENTS 6,893,897 B2 * 5/2005 Sweterlitsch ....... H01L 25/0657
257/E25.013
2014/0145323 A1 5/2014 Lee et al.
(Continued)

FOREIGN PATENT DOCUMENTS

JP 2001-127588 A 5/2001
JP 2006-041199 A 2/2006
(Continued)

OTHER PUBLICATIONS

Machine English Translation of JP2009021267A Published on Jan. 29, 2009 (Year: 2009).*
Official Communication issued in International Patent Application No. PCT/JP2018/020102, dated Aug. 7, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An electronic component device includes first and second mount boards, and first, second, and third electronic components. The first electronic component includes a first major surface and a second major surface, and is disposed on the first mount board. The first major surface is positioned closer to the first mount board than the second major surface. The second electronic component includes a third major surface and a fourth major surface, and is disposed on the second mount board. The third major surface is positioned closer to the second mount board than the fourth major surface. The third electronic component includes a fifth major surface and a sixth major surface, and is disposed on the second mount board. The fifth major surface is positioned closer to the second mount board than the sixth major surface. The second major surface directly contacts the fourth and sixth major surfaces, or indirectly contacts the fourth and sixth major surfaces with a bonding layer interposed therebetween.

19 Claims, 7 Drawing Sheets

(51) Int. Cl.
*H03H 9/10* (2006.01)
*H03H 9/64* (2006.01)
*H03H 9/72* (2006.01)

(58) Field of Classification Search
CPC ............. H03H 9/02834; H03H 9/1071; H03H 9/02574; H03H 9/0547; H01L 2224/32145; H01L 2224/73253; H01L 23/36; H01L 25/00; H01L 25/065; H01L 25/07; H01L 25/18
USPC .......................... 333/133, 187, 188, 193–196
See application file for complete search history.

(56) References Cited

U.S. PATENT DOCUMENTS

| | | |
|---|---|---|
| 2014/0354374 A1 | 12/2014 | Kawachi et al. |
| 2017/0133998 A1 | 5/2017 | Hino |
| 2017/0194937 A1 | 7/2017 | Iwamoto |

FOREIGN PATENT DOCUMENTS

| | | |
|---|---|---|
| JP | 2007-335675 A | 12/2007 |
| JP | 2009-021267 A | 1/2009 |
| JP | 2014-107554 A | 6/2014 |
| JP | 2015-146333 A | 8/2015 |
| WO | 2013/128541 A1 | 9/2013 |
| WO | 2016/039231 A1 | 3/2016 |
| WO | 2016/060072 A1 | 4/2016 |

* cited by examiner

ELECTRONIC COMPONENT DEVICE

CROSS REFERENCE TO RELATED APPLICATIONS

This application claims the benefit of priority to Japanese Patent Application No. 2017-123074 filed on Jun. 23, 2017 and is a Continuation Application of PCT Application No. PCT/JP2018/020102 filed on May 25, 2018. The entire contents of each application are hereby incorporated herein by reference.

BACKGROUND OF THE INVENTION

1. Field of the Invention

The present invention relates to an electronic component device including a mount board on which plural electronic components are mounted.

2. Description of the Related Art

Some currently known electronic component devices have three or more electronic components mounted between two mount boards positioned to face each other. One example of such an electronic component device is a composite component disclosed in International Publication No. 2016/039231. The composite component has two mount boards including a first board and a second board, which is spaced apart from the first board in the vertical direction. Plural components are mounted on the respective major surfaces of the two mount boards. The mounted components are disposed facing each other in the internal space between the two mount boards.

International Publication No. 2016/060072 describes a device as illustrated in FIG. 13. In this device, two electronic components positioned to face each other, such as piezoelectric elements, are each bonded to the other at its back surface located opposite to the major surface located proximate to a bump used for external connection. The device is mounted between a base circuit board, and a routing board.

One conceivable way to improve the heat dissipation of the composite component described in International Publication No. 2016/039231 is to, for example, make the opposing electronic components contact or bond with each other as described in International Publication No. 2016/060072. In this case, heat generated in each of the opposing electronic components can be dissipated through two paths. More specifically, the two paths include a path that allows heat to dissipate through a mount board on which one electronic component is mounted, and a path that allows heat to dissipate, by way of another electronic component in contact with the one electronic component, through a mount board on which the other electronic component is mounted.

However, if heat can be dissipated through only the two heat dissipation paths mentioned above, heat generated in each mounted electronic component may not be dissipated sufficiently in some cases.

SUMMARY OF THE INVENTION

Preferred embodiments of the present invention provide electronic component devices that are each capable of improving heat dissipation for three or more electronic components disposed between a first mount board and a second mount board, which is positioned to face the first mount board and electrically connected with the first mount board.

An electronic component device according to a preferred embodiment of the present invention includes a first mount board, a second mount board positioned to face the first mount board and electrically connected with the first mount board, and three or more electronic components disposed between the first mount board and the second mount board. The three or more electronic components include a first electronic component, a second electronic component, and a third electronic component. The first electronic component is disposed on the first mount board, and includes a first major surface and a second major surface that face away from each other. The second electronic component is disposed on the second mount board, and includes a third major surface and a fourth major surface that face away from each other. The third electronic component is disposed on the second mount board, and includes a fifth major surface and a sixth major surface that face away from each other. The first major surface is positioned closer to the first mount board than the second major surface. The third major surface is positioned closer to the second mount board than the fourth major surface. The fifth major surface is positioned closer to the second mount board than the sixth major surface. The second major surface directly contacts the fourth and sixth major surfaces, or indirectly contacts the fourth and sixth major surfaces with a bonding layer interposed between the second major surface and the fourth and sixth major surfaces.

Preferably, the first electronic component includes a first base body, the second electronic component includes a second base body, and the third electronic component includes a third base body. At least two base bodies among the first base body, the second base body, and the third base body differ from each other in thermal conductivity.

Further, preferably, the first base body has a higher thermal conductivity than the second base body and the third base body.

The first electronic component, which is in contact with the second electronic component and the third electronic component, has more chances of becoming a passage point for the heat to be dissipated and thus tends to conduct more heat during heat dissipation than the second electronic component and the third electronic component. Accordingly, if the first base body of the first electronic component in contact with the second electronic component and the third electronic component has a higher thermal conductivity than the second base body of the second electronic component and the third base body of the third electronic component, more heat is able to be dissipated, leading to improved heat dissipation of the electronic component device.

Preferably, at least one electronic component among the first electronic component, the second electronic component, and the third electronic component is a semiconductor component.

Generally, semiconductor components have high thermal conductivity. Accordingly, if at least one electronic component among the first electronic component, the second electronic component, and the third electronic component is a semiconductor component, the at least one electronic component has high thermal conductivity, thus providing improved heat dissipation of the electronic component device.

Preferably, the first electronic component is a semiconductor component, and the second electronic component and the third electronic component are acoustic wave components.

Generally, semiconductor components are less susceptible to deterioration in characteristics due to heat and have a higher thermal conductivity than acoustic wave components. Further, as described above, the first electronic component has more chances of becoming a passage point for the heat to be dissipated than the second electronic component and the third electronic component.

Accordingly, by using a semiconductor component as the first electronic component, and using acoustic wave components as the second electronic component and the third electronic component, it is possible to reduce or prevent deterioration in the characteristics of the first electronic component, which is the electronic component most affected by heat in the electronic component device. In this case, the second electronic component and the third electronic component are acoustic wave components, and thus it is desired to reduce or prevent deterioration of their characteristics due to heat. In this regard, heat generated in each of the second electronic component and the third electronic component is readily allowed to escape toward a mount board by way of the first electronic component having a high thermal conductivity. This makes it possible to prevent the characteristics of the second and third electronic components from deteriorating due to heat.

Preferably, at least one electronic component among the first electronic component, the second electronic component, and the third electronic component includes at least one portion that switches between an operating state and a non-operating state.

With the above-described configuration, at least one portion of at least one electronic component among the first electronic component, the second electronic component, and the third electronic components switches between operating and non-operating states. Consequently, when the at least one portion of the at least one electronic component is in a non-operating state, a large temperature difference is able to be created between this electronic component and another electronic component. Since heat is conducted faster with increasing temperature difference between the source and destination of the heat being conducted, the above-described configuration helps further improve the heat dissipation of the electronic component device.

Preferably, the electronic component device further includes a component having a switching function. The component having the switching function switches at least one portion of at least one electronic component between an operating state and a non-operating state, the at least one electronic component being at least one of the first electronic component, the second electronic component, and the third electronic component.

With the above-described configuration, at least one portion of at least one electronic component among the first electronic component, the second electronic component, and the third electronic component is able to be switched between operating and non-operating states at desired timing by the component having the switching function. As a result, the heat dissipation of the electronic component device is improved while enabling each electronic component to operate efficiently.

Further, preferably, the component having the switching function switches at least one portion of the first electronic component between an operating state and a non-operating state.

With the above-described configuration, by using the component having the switching function, at least one portion of the first electronic component can be switched between operating and non-operating states, thus making it possible to obtain a state in which at least one portion of the first electronic component is not operating. In this case, when the at least one portion of the first electronic component is in a non-operating state, a large temperature difference is able to be created between the first electronic component, and each of the second and third electronic components. Since the first electronic component is in contact with the second electronic component and the third electronic component, the first electronic component has more chances of becoming a passage point for the heat to be dissipated and thus conducts more heat during heat dissipation than the second electronic component and the third electronic component. Therefore, the above-described configuration helps further improve the heat dissipation of the electronic component device.

Preferably, the first electronic component is a component having a switching function. The component having the switching function switches at least one portion of at least one electronic component between an operating state and a non-operating state, the at least one electronic component being at least one of the second electronic component and the third electronic component.

The above-described configuration makes it possible to obtain a state in which at least one portion of at least one of the second and third electronic components is not operating. In this case, when the at least one portion of the at least one electronic component is in a non-operating state, a large temperature difference is able to be created between the electronic component and another electronic component that is in an operating state. This helps improve the heat dissipation of the electronic component device.

Further, preferably, the at least one electronic component switched by the component having the switching function includes a first filter circuit portion, and a second filter circuit portion. The component having the switching function switches the at least one electronic component between a state in which the first filter circuit portion is operating and the second filter circuit portion is not operating, and a state in which the second filter circuit portion is operating and the first filter circuit portion is not operating.

Preferably, in plan view of the electronic component device seen in the direction of thickness of the first electronic component, the outer periphery of the first electronic component overlaps the outer periphery of the second electronic component or the outer periphery of the third electronic component, or is located outside the outer periphery of the second electronic component or the outer periphery of the third electronic component.

In this regard, the first electronic component has more chances of becoming a passage point for the heat to be dissipated than the second electronic component and the third electronic component. Consequently, with the electronic component device seen in plan view in the direction of thickness of the first electronic component, the greater the area of overlap with the first electronic component, the greater the heat dissipation of the electronic component device. Therefore, the above-described configuration further improves the heat dissipation of the electronic component device in comparison to when, with the electronic component device seen in plan view in the direction of thickness of the first electronic component, the outer periphery of the first electronic component is located inside the outer periphery of the second or third electronic component.

Preferably, at least one of the first mount board and the second mount board includes a heat dissipation mechanism.

The above-described configuration further improves heat dissipation through the mount board, thus enabling further improved heat dissipation of the electronic component device.

Preferably, in plan view of the electronic component device seen in the direction of thickness of the first electronic component, the first mount board differs in area from the second mount board.

With the above-described configuration, of the two mount boards positioned to face each other, heat can be further dispersed through the mount board having the larger area in plan view of the electronic component device seen in the direction of thickness of the first electronic component. This helps improve the heat dissipation of the electronic component device.

Preferably, the electronic component device further includes a sealant provided between the first mount board and the second mount board. The sealant seals the three or more electronic components.

With the above-described configuration, heat generated in each of the first electronic component, the second electronic component, and the third electronic component can be dissipated also through the sealant. This helps further improve the heat dissipation of the electronic component device.

Further, preferably, the bonding layer is made of a material including resin, glass, metal, carbon, ceramics, and a mixture thereof.

Further, preferably, the bonding layer and the sealant are made of the same material. This configuration enables simultaneous and integral formation of the bonding layer and the sealant. This helps facilitate the manufacture of the electronic component device.

Preferably, the first electronic component includes a first base body, the second electronic component includes a second base body, and the third electronic component includes a third base body. The sealant has a thermal conductivity equal or substantially equal to the thermal conductivity of the first base body, the second base body, or the third base body, or has a thermal conductivity higher than the thermal conductivity of the first base body, the second base body, or the third base body.

The above-described configuration results in more heat being conducted from the first electronic component, the second electronic component, and the third electronic component to the sealant than when the sealant has a lower thermal conductivity than the first base body, the second base body, and the third base body. This helps further improve the heat dissipation of the electronic component device.

Preferably, the first electronic component includes a first base body. The first base body has a higher thermal conductivity than the first mount board.

When heat is generated, the heat is dispersed to some extent through a base body before being conducted to a mount board. Therefore, if the first base body has a higher thermal conductivity than the first mount board, the heat dissipation through the mount board improves. This helps improve the heat dissipation of the electronic component device.

Preferably, the second electronic component includes a second base body, and the third electronic component includes a third base body. The second base body or the third base body has a higher thermal conductivity than the second mount board.

When heat is generated, the heat is dispersed to some extent through a base body before being conducted to a mount board. Therefore, if the second base body or the third base body has a higher thermal conductivity than the second mount board, the heat dissipation through the mount board improves. This helps improve the heat dissipation of the electronic component device.

The electronic component devices according to preferred embodiments of the present invention each make it possible to improve heat dissipation for three or more electronic components disposed between a first mount board and a second mount board, which is positioned to face the first mount board and electrically connected with the first mount board.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B illustrate the structure of an electronic component device according to a preferred embodiment of the present invention, of which FIG. 1A is a plan view of the main portion of the electronic component device, and FIG. 1B is a cross-sectional view taken along an arrowed line A1-A1 in FIG. 1A.

FIGS. 11A and 11B illustrate the structure of an electronic component device according to a Modification 1 of a preferred embodiment of the present invention, of which FIG. 11A is a plan view of the main portion of the electronic component device, and FIG. 11B is a cross-sectional view taken along an arrowed line A2-A2 in FIG. 11A.

FIGS. 12A and 12B illustrate the structure of an electronic component device according to a Modification 2 of a preferred embodiment of the present invention, of which FIG. 12A is a plan view of the main portion of the electronic component device, and FIG. 12B is a cross-sectional view taken along an arrowed line A3-A3 in FIG. 12A.

DETAILED DESCRIPTION OF THE PREFERRED EMBODIMENTS

Preferred embodiments of the present invention will be described in detail below with reference to the accompanying drawings.

Preferred Embodiment

1. Basic Structure

Figure 1A:
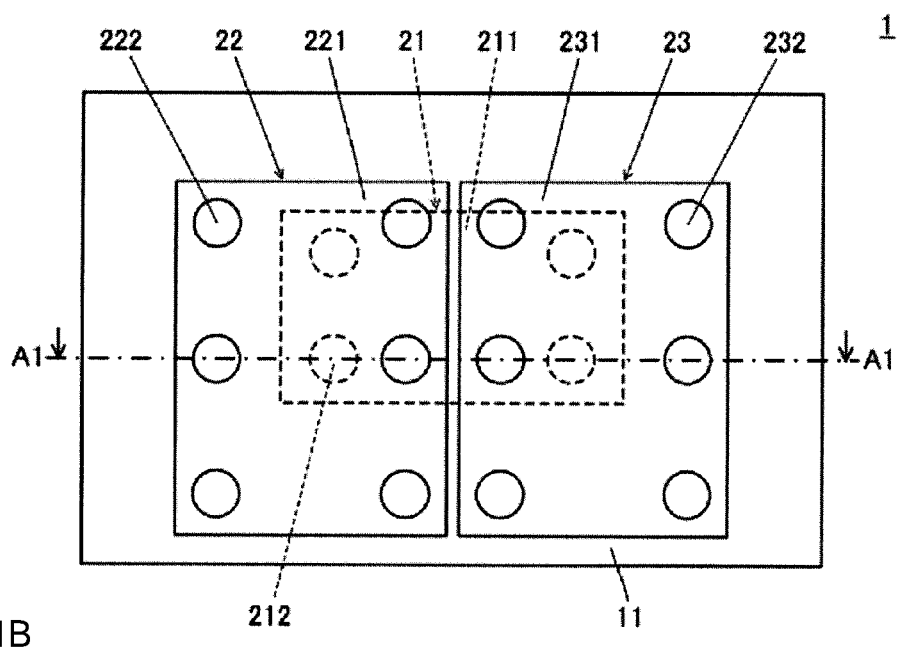
Figure 1B:
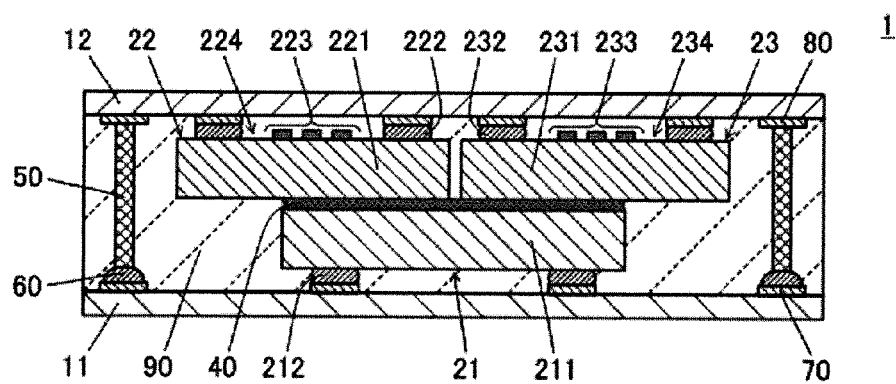

FIGS. 1A and 1B illustrate the structure of an electronic component device (module) 1 according to a preferred embodiment of the present invention. FIG. 1A is a plan view of the electronic component device 1. FIG. 1B is a cross-sectional view taken along an arrowed line A1-A1 in FIG. 1A.

In the following, for convenience of description, an electronic component 21 will be referred to as "first electronic component", an electronic component 22 will be referred to as "second electronic component", and an electronic component 23 will be referred to as "third electronic component".

As illustrated in the plan view of FIG. 1A, the electronic component device 1 includes the first electronic component 21, the second electronic component 22, and the third electronic component 23. As will be described later, the first electronic component 21 includes a first base body 211, and a first outer terminal 212, which is an outer terminal of the first base body 211. The second electronic component 22 includes a second base body 221, and a second outer terminal 222, which is an outer terminal of the second base body 221. The third electronic component 23 includes a third base body 231, and a third outer terminal 232, which is an outer terminal of the third base body 231.

Further, the first base body 211 of the first electronic component 21, and the second base body 221 of the second electronic component 22 at least partially overlap in plan view. Similarly, the first base body 211 of the first electronic component 21, and the third base body 231 of the third electronic component 23 at least partially overlap in plan view. Although, in FIG. 1A, these electronic components overlap such that the long side of the first base body 211 is transverse to the long side of each of the second and third base bodies 221 and 231, how the base bodies 211, 221, and 231 overlap is not limited to the arrangement illustrated in FIG. 1A.

As illustrated in the cross-sectional view of FIG. 1B, the electronic component device 1 includes a first mount board 11, and a second mount board 12 positioned to face the first mount board 11 and electrically connected with the first mount board 11. The first electronic component 21, the second electronic component 22, and the third electronic component 23 are disposed between the first mount board 11 and the second mount board 12.

The first electronic component 21 is preferably, for example, a semiconductor switching component including the first base body 211 made of silicon, and the first outer terminal 212 of the first base body 211. The second electronic component 22 is preferably, for example, a surface acoustic wave filter component including the second base body 221 made of lithium niobite (to be referred to as LN hereinafter) or lithium tantalate (to be referred to as LT hereinafter), and the second outer terminal 222. The third electronic component 23 is preferably, for example, a surface acoustic wave filter component including the third base body 231 made of LN or LT, and the third outer terminal 232.

The first outer terminal 212, the second outer terminal 222, and the third outer terminal 232 are respectively disposed on one major surface of the first base body 211, one major surface of the second base body 221, and one major surface of the third base body 231. Further, an interdigital transducer (IDT) electrode 223 and an IDT electrode 233 are respectively provided on the second base body 221 and the third base body 231.

The first base body 211 and the second base body 221 are bonded to each other with a bonding layer 40 interposed therebetween. The first base body 211 and the third base body 231 are also bonded to each other with the bonding layer 40 interposed therebetween. The bonding layer 40 is made of any thermally conductive material. More specifically, the bonding layer 40 may be any layer made of a material with a higher thermal conductivity than air. The first base body 211 and the second base body 221 are bonded to each other at a major surface located opposite to the major surface provided with the corresponding outer terminal. The first base body 211 and the third base body 231 are bonded to each other at a major surface located opposite to the major surface provided with the corresponding outer terminal. Accordingly, the first electronic component 21 is mounted such that a major surface of the first base body 211 provided with the first outer terminal 212 is located proximate to the first mount board 11. Similarly, the second electronic component 22 is disposed such that a major surface of the second base body 221 provided with the second outer terminal 222 is located proximate to the second mount board 12. The third electronic component 23 is disposed such that a major surface of the third base body 231 provided with the third outer terminal 232 is located proximate to the second mount board 12. The first, second, and third electronic components 21, 22, and 23 are respectively mounted using the first, second, and third outer terminals 212, 222, and 232. Examples of the materials of the first, second, and third outer terminals 212, 222, and 232 include bumps, pillars, or particles made of a metal, such as solder, gold, silver, or copper, or a compound thereof, and electrically conductive pastes.

Each of the first mount board 11 and the second mount board 12 is preferably, for example, a printed circuit board, a ceramic board, an interposer board made of silicon or glass, or a flexible board. The first mount board 11 and the second mount board 12 are electrically connected using, for example, a via-conductor 50, a bump 60, or other such interconnection such that the two mount boards face each other. The interconnection may be any interconnection including an electrically conductive material that enables electrical connection between the first mount board 11 and the second mount board 12. Other than a via-conductor and a bump, such an interconnection may be, for example, a component such as a connector, or a pillar. The via-conductor 50 and the bump 60 are connected to an electrode pad 70 provided on the first mount board 11 or to an electrode pad 80 provided on the second mount board 12. The via-conductor 50, the bump 60, and the electrode pads 70 and 80 may not be provided.

Further, the first electronic component 21, the second electronic component 22, the third electronic component 23, a major surface of the first mount board 11 located proximate to the second mount board 12, and a major surface of the second mount board 12 located proximate to the first mount board 11 are sealed by a sealant 90 including resin or other such material, for example. At this time, air gaps 224 and 234 are respectively provided between the second electronic component 22 and the second mount board 12, and between the third electronic component 23 and the second mount board 12 to allow excitation of the IDT electrodes 223 and 233. No air gap is required between the first electronic component 21, which is provided with no IDT electrode, and the first mount board 11.

Although the first electronic component 21 is a semiconductor switching component, and the second electronic component 22 and the third electronic component 23 are surface acoustic wave filter components in the preferred embodiment described above, this may not necessarily be the case. If the first electronic component 21 is a semiconductor switching component, the second electronic component 22 and the third electronic component 23 can each be a component with any desired function. Examples of such components with any such function include an acoustic wave component using an acoustic boundary wave or bulk wave, a dielectric component, a magnetic component, a sensor component, an amplifying component such as a power amplifier or low-noise amplifier, a passive component such as a coupler, and a component such as a memory or application processor.

Further, the electronic component device according to the present preferred embodiment may include four or more electronic components. The aggregates defined by the first, second, and third electronic components 21, 22, and 23 having the above-described relationship is not limited to one. The electronic component device may include plural such aggregates. Similarly, the electronic component device according to the present preferred embodiment may include any plural number of mount boards. For example, the electronic component device may include three or more mount boards positioned to face each other and electrically connected with each other.

Figure 2A:
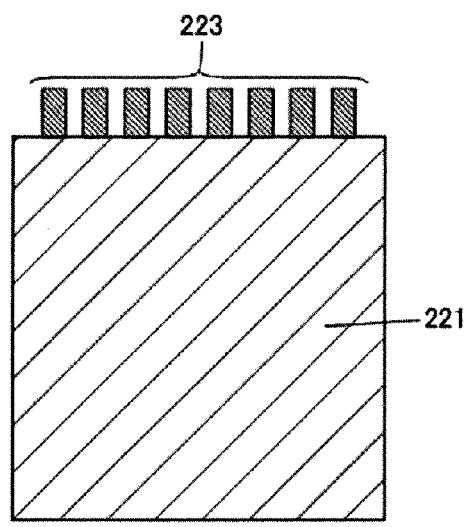
FIGS. 2A and 2B are schematic cross-sectional views of a second base body of an electronic component device according to a preferred embodiment of the present invention, illustrating different implementations of the second base body.
Figure 2B:
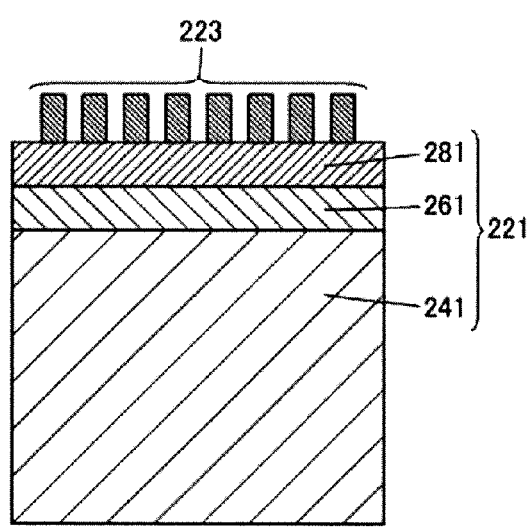

Referring to FIGS. 2A and 2B, an exemplary configuration of each of the first, second, and third base bodies will be described. Although the second base body 221 will be described below as an example of each base body according to the present preferred embodiment, the first base body 211 and the third base body 231 can have the same or substantially the same features as the second base body 221.

FIGS. 2A and 2B are schematic cross-sectional views of the second base body 221. FIGS. 2A and 2B illustrate different configurations of the second base body 221 on which the IDT electrode 223 is provided.

As illustrated in FIG. 2A, the second base body 221 may be a single-layer component made of LN or LT. The second base body 221 may be made of any other suitable material, examples of which include a semiconductor such as gallium arsenide, an amorphous material such as glass, a crystalline material such as sapphire, diamond, ceramics, or metal, and a mixture thereof.

As illustrated in FIG. 2B, the second base body 221 may be a multilayer body including plural stacked layers. For example, the second base body 221 illustrated in FIG. 2B includes a high acoustic velocity support substrate 241, a low acoustic velocity film 261 stacked directly or indirectly over the high acoustic velocity support substrate 241, and a piezoelectric film 281 stacked directly or indirectly over the low acoustic velocity film 261. The term high acoustic velocity support substrate as used herein refers to a support substrate in which a bulk wave propagates at an acoustic velocity higher than the acoustic velocity of an acoustic wave propagating in the piezoelectric film. The high acoustic velocity support substrate 241 is mainly made of silicon or aluminum nitride. The term low acoustic velocity film as used herein refers to a film made of a material in which a bulk wave propagates at an acoustic velocity lower than the acoustic velocity of an acoustic wave propagating in the piezoelectric film. As the material of the low acoustic velocity film 261, for example, silicon oxide, glass, or a compound with fluorine, carbon, or boron added to silicon oxide can be used. In addition, the piezoelectric film 281 is preferably made of, for example, a piezoelectric monocrystal such as LT or LN, or piezoelectric ceramics. Using the above-described multilayer body as the second base body does not impede the advantageous effects of the present invention.

Figure 3:
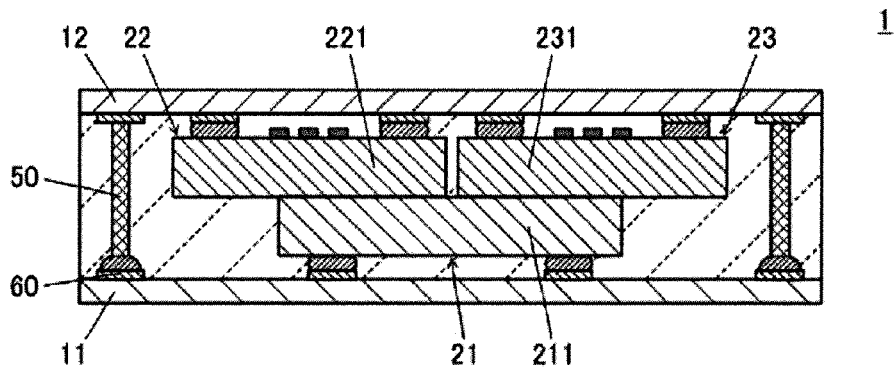
FIG. 3 is a cross-sectional view with a first base body and a third base body directly contacting each other with no bonding layer interposed therebetween.

As illustrated in FIG. 3, the first base body 211 and the second base body 221 may be in direct contact with each other with no bonding layer interposed therebetween, and the first base body 211 and the third base body 231 may be in direct contact with each other with no bonding layer interposed therebetween. In this case as well, advantageous effects of the present invention can be sufficiently obtained. Similarly, providing no gap between the second base body 221 and the third base body 231 does not impede the advantageous effects of the present invention.

The electronic component device 1 according to the present preferred embodiment includes the first mount board 11, the second mount board 12 positioned to face the first mount board 11 and electrically connected with the first mount board 11, and three or more electronic components including the first, second, and third electronic components 21, 22, and 23 disposed between the first mount board 11 and the second mount board 12. The first electronic component 21 is disposed on the first mount board 11, and includes a first major surface and a second major surface that face away from each other. The second electronic component 22 is disposed on the second mount board 12, and includes a third major surface and a fourth major surface that face away from each other. The third electronic component 23 is disposed on the second mount board 12, and includes a fifth major surface and a sixth major surface that face away from each other. The first major surface of the first electronic component 21 is positioned closer to the first mount board 11 than the second major surface of the first electronic component 21. The third major surface of the second electronic component 22 is positioned closer to the second mount board 12 than the fourth major surface of the second electronic component 22. The fifth major surface of the third electronic component 23 is positioned closer to the second mount board 12 than the sixth major surface of the third electronic component 23. The second major surface of the first electronic component 21 is in contact with the fourth major surface of the second electronic component 22 and the sixth major surface of the third electronic component 23, either directly or indirectly with the bonding layer 40 interposed therebetween.

2. Differences from Comparative Example

The above-described configuration according to the present preferred embodiment can provide an electronic component device that has a greater number of paths through which heat can be dissipated (heat dissipation paths) than an electronic component device according to a comparative example. The reason for this will be described below.

Figure 13:
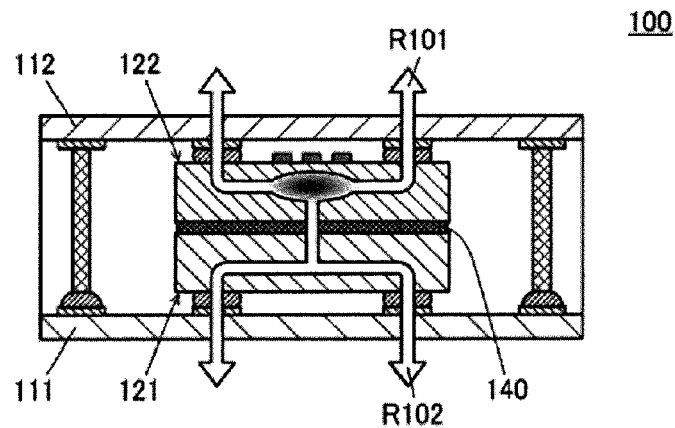
FIG. 13 is a cross-sectional view of an electronic component device according to a comparative example, schematically illustrating possible dissipation paths for heat generated in the electronic component device.

FIG. 13 is a cross-sectional view of an electronic component device 100 according to a comparative example, schematically illustrating dissipation paths for heat generated in an electronic component 122. In the electronic component device 100, an electronic component 121 and the electronic component 122 are disposed between a mount board 111 and a mount board 112. The electronic component 121 mounted on the mount board 111, and the electronic component 122 mounted on the mount board 112 face each other. The electronic component 121 and the electronic component 122 are bonded to each other with a bonding layer 140 interposed therebetween. In this case, heat generated in the electronic component 122 is mainly dissipated through two paths indicated by arrows R101 and R102. More specifically, the two paths include the path R101 leading from the electronic component 122 to the mount board 112, and the path R102 leading from the electronic component 122 to the mount board 111 by way of the bonding layer 140 and the electronic component 121. As with the electronic component 122, heat generated in the electronic component 121 can be dissipated mainly through two paths.

Figure 4:
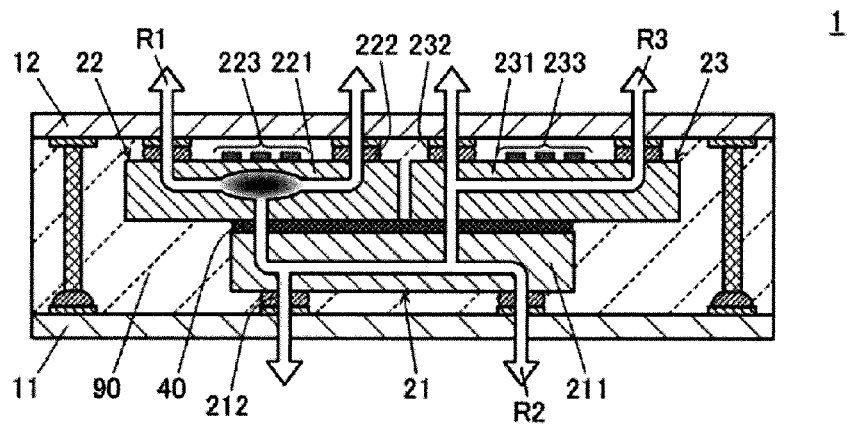
FIG. 4 is a cross-sectional view of an electronic component device according to a preferred embodiment of the present invention, schematically illustrating possible dissipation paths for heat generated in the electronic component device.

FIG. 4 is a cross-sectional view of the electronic component device 1 according to the present preferred embodiment, schematically illustrating dissipation paths for heat generated in the second electronic component 22. Three electronic components including the first electronic component 21, the second electronic component 22, and the third electronic component 23 are disposed between two mount boards including the first mount board 11 and the second mount board 12. The first electronic component 21 is mounted on the first mount board 11, and the second electronic component 22 and the third electronic component 23 are mounted on the second mount board 12. The first electronic component 21 faces the second electronic component 22 and the third electronic component 23. The first electronic component 21 and the second electronic component 22 are bonded to each other using the bonding layer 40, and the first electronic component 21 and the third electronic component 23 are bonded to each other using the bonding layer 40. In this case, heat generated in the second electronic component 22 of the electronic component device 1 is mainly dissipated through three paths indicated by arrows R1, R2, and R3 in FIG. 4. More specifically, the three paths include the path R1 leading from the second electronic component 22 to the second mount board 12, the path R2 leading from the second electronic component 22 to the first mount board 11 by way of the bonding layer 40 and the first electronic component 21, and the path R3 leading from the second electronic component 22 to the second mount board 12 by way of the bonding layer 40, the first electronic component 21, and the third electronic component 23. As with the second electronic component 22, heat generated in each of the first electronic component 21 and the third electronic component 23 can also be dissipated mainly through three paths.

As described above, as compared with the electronic component device 100 according to the comparative example, the number of heat dissipation paths in the electronic component device 1 according to the present preferred embodiment can be increased from two to three. This helps further improve the heat dissipation of the electronic component device 1.

3. Examples

Examples of the electronic component device according to preferred embodiments of the present invention will be described below. Each of the examples below is substantially similar in its structure to the basic structure mentioned above, and only differs from the basic structure in the function or type of each individual electronic component. Accordingly, the following description explains how differences in the function or type of each individual electronic component affect the electronic component device according to the present preferred embodiment.

A. Example 1

First, the following describes, as an electronic component device according to an Example 1 of a preferred embodiment of the present invention, an electronic component device in which at least two electronic components among the first electronic component 21, the second electronic component 22, and the third electronic component 23 are acoustic wave components or semiconductor components. Example 1 represents a case with a restriction placed on the type of each electronic component provided in the electronic component device 1 according to the basic structure. Accordingly, the same reference signs as those used for the electronic component device 1 according to the basic structure will be used in the following description.

I. First Aspect

In an electronic component device according to a first aspect of the Example 1, the first electronic component 21 is a semiconductor component, and the second electronic component 22 and the third electronic component 23 are acoustic wave components.

Acoustic wave components have relatively high temperature coefficients of frequency (TCF), which represent the magnitude of change in frequency associated with a change in temperature. Consequently, if heat becomes trapped within such a component, it is difficult for the component to maintain frequency accuracy, resulting in significant deterioration of its characteristics. If the electronic component device according to the present preferred embodiment includes plural acoustic wave components, such acoustic wave components are preferably used as the second electronic component 22 and the third electronic component 23 rather than as the first electronic component 21. This is because the amount of heat conducted through the second electronic component 22 and the third electronic component 23 tends to be less than the amount of heat conducted through the first electronic component 21. In the first place, the second electronic component 22 and the third electronic component 23 tend to have less chances of becoming a passage point for heat dissipation paths than the first electronic component 21. The first electronic component 21 serves as a passage point for each of two dissipation paths for heat generated in the other electronic components (the second electronic component 22 and the third electronic component 23) that constitute an aggregate together with the first electronic component 21. More specifically, the first electronic component 21 serves as a passage point for the path that leads to the first mount board 11 by way of the bonding layer 40 and the first electronic component 21, and for the path that leads to the second mount board 12 by way of the bonding layer 40, the first electronic component 21, and the second or third electronic component 22 or 23. By contrast, the second electronic component 22 and the third electronic component 23 each define and function as a passage point for one dissipation path to dissipate heat generated in the other electronic components (the first electronic component 21 and the third electronic component 23, or the first electronic component 21 and the second electronic component 22) that define an aggregate together with the second or third electronic component 22 or 23. More specifically, the second electronic component 22 and the third electronic component 23 each define and function as a passage point only for the path that leads to the second mount board 12 by way of the bonding layer 40 and the second or third electronic component 22 or 23. As described above, the second electronic component 22 and the third electronic component 23 tend to have less chances of becoming a passage point for heat dissipation paths, and thus a relatively small amount of heat tends to be conducted through the second electronic component 22 and the third electronic component 23.

The first electronic component 21 is preferably a semiconductor component with a base body made of silicon, gallium arsenide, or other such material. If acoustic wave components are used as the second electronic component 22 and the third electronic component 23, it is preferable to use, as the first electronic component 21, a semiconductor component with a higher thermal conductivity than these acoustic wave components. As described above, the first electronic component 21 can define and function as a point through which heat generated in each of the second and third electronic components 22 and 23 passes as the heat is dissipated. At this time, if a semiconductor component with a higher thermal conductivity than an acoustic wave component is used as the first electronic component 21, heat is less likely to become trapped within the second electronic component 22 or the third electronic component 23, thus making it possible to obtain the electronic component device 1 with less deterioration in characteristics.

In the first aspect of the Example 1 described above, the first electronic component 21, which is an example of at least one electronic component among the first electronic component 21, the second electronic component 22, and the third electronic component 23, is a semiconductor component.

Generally, semiconductor components have high thermal conductivity. Accordingly, using a semiconductor component as the first electronic component 21 results in increased thermal conductivity of the first electronic component 21, thus allowing for improved heat dissipation of the electronic component device.

The first electronic component 21 is a semiconductor component, and the second electronic component 22 and the third electronic component 23 are acoustic wave components.

Generally, semiconductor components are less susceptible to deterioration in characteristics due to heat than acoustic wave components. Further, as described above, the first electronic component 21 has more chances of becoming a passage point for the heat being dissipated than the second electronic component 22 and the third electronic component 23.

Accordingly, by using a semiconductor component as the first electronic component 21, and using acoustic wave components as the second electronic component 22 and the third electronic component 23, it is possible to prevent deterioration in the characteristics of the first electronic component 21, which is the electronic component most affected by heat in the electronic component device. The second electronic component 22 and the third electronic component 23 are acoustic wave components, and thus it is preferable to prevent deterioration of their characteristics caused by heat. In this regard, heat generated in each of the second electronic component 22 and the third electronic component 23 is readily allowed to escape toward a mount board by way of the first electronic component 21 having a high thermal conductivity. This makes it possible to prevent the second electronic component 22 and the third electronic component 23 from deteriorating in characteristics due to heat.

II. Second Aspect

In an electronic component device according to a second aspect of the Example 1, preferably, the first electronic component is an acoustic wave component, and the second electronic component and the third electronic component are semiconductor components.

If the electronic component device according to the present preferred embodiment includes only one acoustic wave component among electronic components that define an aggregate, it is preferable to use such an acoustic wave component as the first electronic component 21, and to use semiconductor components as the second electronic component 22 and the third electronic component 23 as with the second aspect. For the dissipation paths for heat generated in the first electronic component 21, the number of electronic components through which heat passes before reaching the first mount board 11 is zero, and the number of electronic components through which heat passes before reaching the second mount board 12 is two. By contrast, for the dissipation paths for heat generated in each of the second electronic component 22 and the third electronic component 23, the number of electronic components through which heat passes before reaching the first mount board 11 is one, and the number of electronic components through which heat passes before reaching the second mount board is zero or two. Thus, the maximum number of electronic components through which heat generated in the first electronic component 21 passes before reaching a mount board is less than the maximum number of electronic components through which heat generated in each of the second electronic component 22 and the third electronic component 23 passes before reaching a mount board. In other words, for the dissipation paths for heat generated in the first electronic component 21, the distance to the target mount board tends to be shorter than that for the heat dissipation paths for heat generated in each of the second electronic component 22 and the third electronic component 23. For a heat dissipation path, the shorter the distance to the mount board through which to dissipate heat away from the electronic component device, the faster the heat dissipation and the higher the heat dissipation capability. Accordingly, if only one acoustic wave component with a comparatively high TCF is to be used, it would be optimal to use the acoustic wave component as the first electronic component 21 partially including a heat dissipation path with a relatively high heat dissipation capability.

In this case as well, if semiconductor components, which have higher thermal conductivity than acoustic wave components, are used as the second electronic component 22 and the third electronic component 23, heat is less likely to become trapped within the first electronic component 21, which uses each of these electronic components as a passage point for heat during heat dissipation. This helps further reduce deterioration in the characteristics of the electronic component device 1. Even if only one of the second electronic component 22 and the third electronic component 23 is a semiconductor component, the above-described advantageous effects, namely the reduced deterioration in characteristics due to less heat being trapped within the first electronic component 21, can be sufficiently obtained.

B. Example 2

The following describes, with reference to FIGS. 5 to 10, an electronic component device according to an Example 2 in which the first electronic component 21 is a switching component and the second electronic component 22 and the third electronic component 23 are filter components. The aspects of Example 2 described below each represent an example in which the electronic component device 1 according to the basic structure is an electronic component device 1A, 1B, 1C, or 1D including a switching function and a filter function.

I. First Aspect

First, an electronic component device 1A according to a first aspect of the Example 2 will be described with reference to FIGS. 5 and 6. The electronic component device 1A according to the first aspect has a switching function to perform switching for two filter components among three electronic components that define an aggregate.

Figure 5:
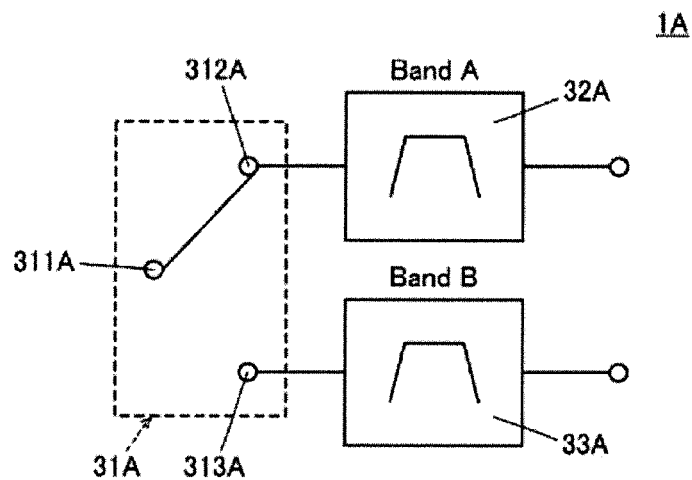
FIG. 5 is a circuit diagram illustrating a circuit provided in an electronic component device according to a first aspect of an Example 2.

FIG. 5 is a circuit diagram illustrating a circuit provided in the electronic component device 1A according to the first aspect of the Example 2. As illustrated in FIG. 5, the electronic component device 1A according to the first aspect includes a circuit that includes a switching circuit portion 31A and filter circuit portions 32A and 33A.

The switching circuit portion 31A includes a common terminal 311A, a first selector terminal 312A, and a second selector terminal 313A. The switching circuit portion 31A switches whether to connect the common terminal 311A with the first selector terminal 312A or connect the common terminal 311A with the second selector terminal 313A. The first selector terminal 312A is connected to the filter circuit portion 32A, and the second selector terminal 313A is connected to the filter circuit portion 33A. In FIG. 5, when the common terminal 311A and the first selector terminal 312A are connected, the filter circuit portion 32A becomes conducting, and the filter circuit portion 33A becomes non-conducting. When the common terminal 311A and the second selector terminal 313A are connected, the filter circuit portion 32A becomes non-conducting, and the filter circuit portion 33A becomes conducting.

At this time, the filter circuit portion 32A is preferably, for example, a filter circuit portion that selectively passes communication signals in the communication band "Band A", and the filter circuit portion 33A is, for example, a filter circuit portion that selectively passes communication signals in the communication band "Band B". FIG. 5 depicts a state in which the common terminal 311A and the first selector terminal 312A are connected and the filter circuit portion 32A is thus conducting. It is assumed that each circuit portion illustrated in FIG. 5 is incorporated in one of a first electronic component 21A, a second electronic component 22A, and a third electronic component 23A, which are provided in the electronic component device 1A described below with reference to FIG. 6.

Figure 6:
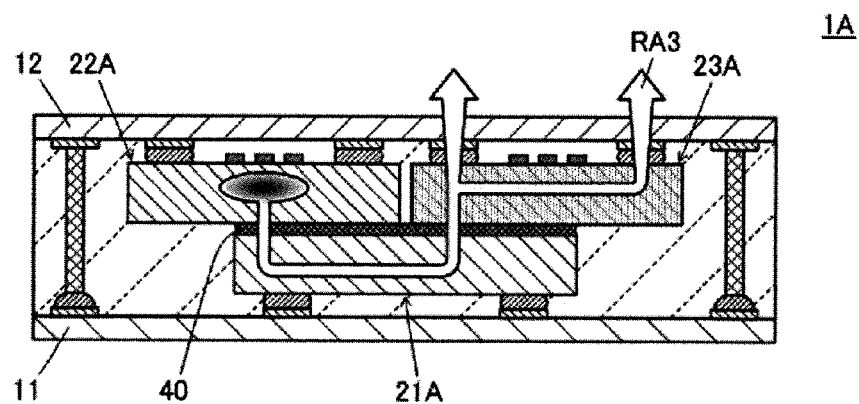
FIG. 6 is a cross-sectional view of the electronic component device according to the first aspect of the Example 2, schematically illustrating the structure of the electronic component device, and possible dissipation paths for heat generated in the electronic component device.

FIG. 6 is a cross-sectional view of the electronic component device 1A according to the first aspect of the Example 2, schematically illustrating the structure of the electronic component device 1A and dissipation paths for heat generated in the second electronic component 22A.

The first electronic component 21A is a switching component incorporating the switching circuit portion 31A described above. The second electronic component 22A is a controlled component incorporating the filter circuit portion 32A, which is controlled by the switching circuit portion 31A to switch between conducting and non-conducting states. The third electronic component 23A is a controlled component incorporating the filter circuit portion 33A, which is controlled by the switching circuit portion 31A to switch between conducting and non-conducting states. Each electronic component becomes operating when the incorporated circuit portion is conducting, and becomes non-operating when the circuit portion is non-conducting. In other words, the first electronic component 21A is a switching component for switching between a state in which the second electronic component 22A is operating and the third electronic component 23A is not operating, and a state in which the second electronic component 22A is not operating and the third electronic component 23A is operating.

When the state of the circuit in the electronic component device 1A is such that, as illustrated in FIG. 5, the common terminal 311A and the first selector terminal 312A are connected and the filter circuit portion 32A is thus conducting, the second electronic component 22A incorporating the filter circuit portion 32A becomes operating and generates heat. At this time, the filter circuit portion 33A incorporated in the third electronic component 23A becomes non-conducting, and thus the third electronic component 23A becomes non-operating and generates no heat. In this case, the temperature of the third electronic component 23A that is not generating heat tends to become significantly lower than the temperature of the second electronic component 22A that is generating heat. Heat is generally conducted from areas of high temperature to areas of low temperature. Thus, the greater the temperature difference between the source and destination of the heat being conducted, the faster the heat conduction and the greater the amount of heat conducted. Consequently, the configuration according to the first aspect helps significantly improve the heat dissipation capability of the heat dissipation path indicated by an arrow RA3, which leads from the second electronic component 22A to the second mount board 12 by way of the third electronic component 23A.

Further, when the third electronic component 23A is not generating heat, the temperature of the first electronic component 21A tends to become lower than when the third electronic component 23A is generating heat. This is because the first electronic component 21A is bonded to the third electronic component 23A with the bonding layer 40 interposed therebetween. The lower temperature of the first electronic component 21A helps improve the heat dissipation capability of the heat dissipation path that leads from the second electronic component 22A to the first mount board 11 by way of the first mount board 11.

As described above, the heat dissipation capability of one or more heat dissipation paths within the electronic component device 1A can be readily improved, which helps improve the heat dissipation of the electronic component device 1A. The same or substantially the same advantageous effect described above can also be obtained for a configuration in which, conversely to the above-described configuration, the first electronic component 21A switches the second electronic component 22A into a non-operating state and switches the third electronic component 23A into an operating state. This configuration helps improve the heat dissipation capability of the path leading from the third electronic component 23A to the first mount board 11 or the second mount board 12 by way of the first electronic component 21A or the second electronic component 22A. This also helps improve the heat dissipation of the electronic component device 1A.

As with the first aspect, the first electronic component 21A is preferably a switching component. In the electronic component device 1A, more heat tends to be conducted through the first electronic component 21A than through the second electronic component 22A and the third electronic component 23A. In this regard, among numerous electronic components, switching components generate comparatively less heat when operating, and thus tend to conduct large amounts of heat. Accordingly, using such a switching component as the first electronic component 21A helps further improve the heat dissipation of the electronic component device 1A.

In the first aspect of the Example 2 described above, the second and third electronic components 22A and 23A, which represent an example of at least one electronic component among the first electronic component 21A, the second electronic component 22A, and the third electronic component 23A, include at least one portion that switches between operating and non-operating states.

With the above-described configuration, at least one portion of each of the second and third electronic components 22A and 23A switches between operating and non-operating states. Consequently, when the at least one portion of each electronic component is in a non-operating state, a large temperature difference can be created between the electronic component and another electronic component. Since heat is conducted faster with increasing temperature difference between the source and destination of the heat being conducted, the above-described configuration helps further improve the heat dissipation of the electronic component device.

The first electronic component 21A is preferably a component having a switching function to switch, between operating and non-operating states, at least one portion of each of the second and third electronic components 22A and 23A, which represent an example of at least one electronic component among the first electronic component 21A, the second electronic component 22A, and the third electronic component 23A.

The above-described configuration makes it possible to obtain a state in which at least one portion of each of the second and third electronic components 22A and 23A is not operating. In this case, when the at least one portion of each such electronic component is in a non-operating state, a large temperature difference can be created between the electronic component and another electronic component that is in an operating state. This helps improve the heat dissipation of the electronic component device.

The second and third electronic components 22A and 23A, which represent an example of at least one electronic component to be switched by the first electronic component 21A having a switching function, respectively include, in at least one portion thereof, the filter circuit portion 32A defining and functioning as a first filter circuit portion, and the filter circuit portion 33A defining and functioning as a second filter circuit portion. The first electronic component 21A switches the at least one electronic component between a state in which the filter circuit portion 32A is operating and the filter circuit portion 33A is not operating, and a state in which the filter circuit portion 33A is operating and the filter circuit portion 32A is not operating.

Instead of the first electronic component 21A, the second electronic component 22A or the third electronic component 23A may be a switching component. In other words, the first electronic component 21A may be a controlled component controlled by the switching component to switch between operating and non-operating states. In this case, the first electronic component 21A can be switched into a non-operating, non-heat generating state. This causes the speed and amount of heat conduction to the first electronic component 21A to increase significantly. Among heat dissipation paths within the electronic component device 1A, more heat dissipation paths pass through the first electronic component 21A than through the second electronic component 22A and the third electronic component 23A. Accordingly, for the case where the first electronic component 21A is a controlled component, the number of heat dissipation paths with a significant improvement in heat dissipation capability is greater than the number of heat dissipation paths with no such improvement. This also helps significantly improve the heat dissipation of the electronic component device 1A.

II. Second Aspect

As an electronic component device according to a second aspect of the Example 2, an electronic component device 1B will be described below with reference to FIGS. 7 and 8. In the electronic component device 1B, only one electronic component among the first electronic component, the second electronic component, and the third electronic component is switched by a switching function.

Figure 7:
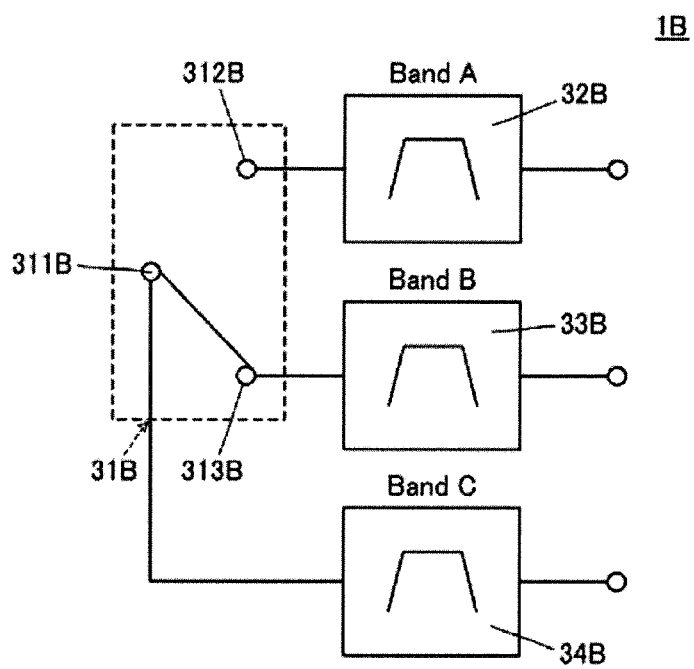
FIG. 7 is a circuit diagram illustrating a circuit provided in an electronic component device according to a second aspect of the Example 2.

FIG. 7 is a circuit diagram illustrating a circuit incorporated in the electronic component device 1B according to the second aspect of the Example 2.

The electronic component device 1B according to the second aspect further includes a filter circuit portion 34B added to the circuit incorporated in the electronic component device 1A according to the first aspect. The filter circuit portion 34B is preferably, for example, a filter circuit portion that selectively passes communication signals in the communication band "Band C". In the circuit diagram of FIG. 7, the filter circuit portion 34B is not connected with a first selector terminal 312B and a second selector terminal 313B, and is always connected with a common terminal 311B of a switching circuit portion 31B. In other words, the filter circuit portion 34B is always in a conducting state. FIG. 7 depicts a state in which the common terminal 311B and the second selector terminal 313B are connected, and thus a filter circuit portion 33B is conducting and a filter circuit portion 32B is non-conducting. However, it is also possible to connect the common terminal 311B with the first selector terminal 312B to attain a state in which the filter circuit portion 32B is conducting and the filter circuit portion 33B is non-conducting. As with the first aspect, it is assumed that each circuit portion illustrated in FIG. 7 is incorporated in one of a first electronic component 21B, a second electronic component 22B, and a third electronic component 23B in the electronic component device 1B described below with reference to FIG. 8.

Figure 8:
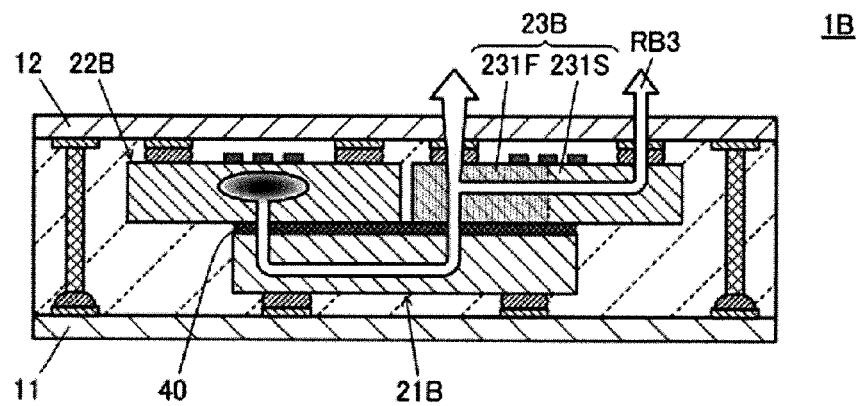
FIG. 8 is a cross-sectional view of the electronic component device according to the second aspect of the Example 2, schematically illustrating the structure of the electronic component device, and possible dissipation paths for heat generated in the electronic component device.

FIG. 8 is a cross-sectional view of the electronic component device 1B according to the second aspect of the Example 2, schematically illustrating the structure of the electronic component device 1B and dissipation paths for heat generated in the second electronic component 22B.

As with the first aspect, the first electronic component 21B is a switching component incorporating the switching circuit portion 31B illustrated in FIG. 7. In the second aspect, the second electronic component 22B incorporates the filter circuit portion 34B illustrated in FIG. 7. The third electronic component 23B is a controlled component that incorporates both the filter circuit portion 32B and the filter circuit portion 33B, and is switched by the switching circuit portion 31B such that one of the two filter circuit portions is rendered conducting and the other filter circuit portion is rendered non-conducting. The filter circuit portion 32B is incorporated in a first region 231F of the third electronic component 23B, and the filter circuit portion 33B is incorporated in a second region 231S of the third electronic component 23B. Each region becomes operating when the incorporated circuit portion is conducting, and becomes non-operating when the incorporated circuit portion is non-conducting. In other words, the first electronic component 21B is a switching component to switch between a state in which the first region 231F is rendered operating and the second region 231S is rendered non-operating, and a state in which the first region 231F is rendered non-operating and the second region 231S is rendered operating.

In the electronic component device 1B, the second electronic component 22B incorporates the filter circuit portion 34B, which is always conducting. The second electronic component 22B thus always generates heat. By contrast, the third electronic component 23B includes both a region that generates heat, and a region that does not generate heat. More specifically, when the common terminal 311B and the second selector terminal 313B are connected as illustrated in FIG. 7, the first region 231F, which includes the filter circuit portion 32B that is non-conducting, does not generate heat, and the second region 231S, which includes the filter circuit portion 33B that is conducting, generates heat. A large temperature difference can be readily created between the second electronic component 22B, and the first region 231F of the third electronic component 23B. As a result, for a heat dissipation path RB3 leading from the second electronic component 22B to the second mount board 12 by way of the third electronic component 23B, a portion of the heat dissipation path RB3 that passes through the first region 231F can be readily improved in heat dissipation capability. Thus, also for the case where a controlled component includes one region that becomes non-operating, the heat dissipation capability of a heat dissipation path provided in the electronic component device 1B increases, thus readily enabling improved heat dissipation of the electronic component device 1B. Accordingly, a state in which an electronic component is not operating refers not only to when a single electronic component is not operating in its entirety, but also to when a portion of a single electronic component is not operating.

As with the first region 231F illustrated in FIG. 8, if a region in each electronic component that becomes non-operating at least partially faces another electronic component that the electronic component contacts or bonds with, the other electronic component also tends to decrease in temperature. In FIG. 8, the first region 231F of the third electronic component 23B faces the first electronic component 21B. Accordingly, a region in the first electronic component 21B that faces the first region 231F also tends to decrease in temperature in comparison to when the first region 231F generates heat. This also improves the heat dissipation capability of the heat dissipation path leading to the first mount board 11 by way of the first electronic component 21B, in comparison to when the third electronic component 23B is not a controlled component.

In an alternative configuration different from the above-described configuration, the controlled component including at least one portion that becomes non-operating may be the second electronic component 22B. In another alternative configuration, the switching component may be the second electronic component 22B or the third electronic component 23B, and the controlled component including at least one portion that becomes non-operating may be the first electronic component 21B. These configurations also provide improved heat dissipation capability of the heat dissipation path in the same manner as described above.

III. Third Aspect

Although the first and second aspects described above are each directed to the case where one of the first electronic component, the second electronic component, and the third electronic component is a switching component, alternatively, a component other than the first electronic component, the second electronic component, and the third electronic component may be a switching component. Such an electronic component device will be described below with reference to FIGS. 9 and 10 as an electronic component device 1C or 1D according to a third or fourth aspect.

Figure 9:
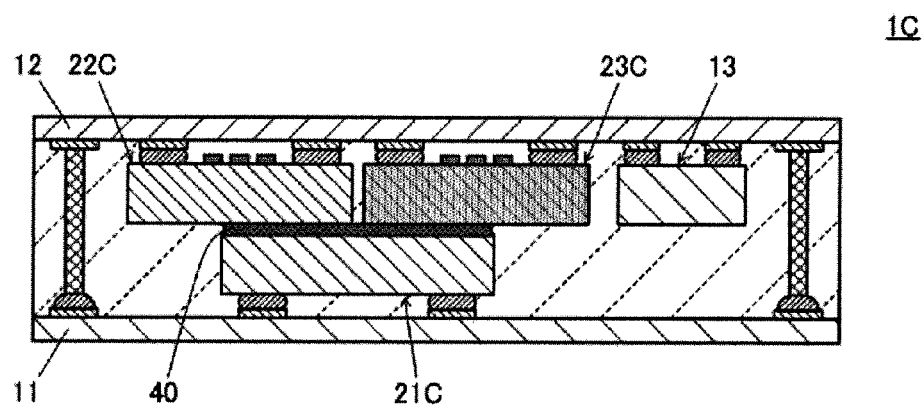
FIG. 9 is a cross-sectional view of an electronic component device according to a third aspect of the Example 2, illustrating the structure of the electronic component device.

FIG. 9 is a cross-sectional view of an electronic component device 1C, illustrating the structure of the electronic component device 1C that further includes a switching component 13, which is separate from a first electronic component 21C, a second electronic component 22C, and a third electronic component 23C.

As with the switching component according to the first aspect, for example, the switching component 13 mounted on the second mount board 12 incorporates a switching circuit portion that controls switching such that one of the second electronic component 22C and the third electronic component 23C is rendered operating and the other electronic component is rendered non-operating. In this case, the first electronic component 21C is a component other with a switching component, such as a sensor component, for example. In FIG. 9, the third electronic component 23C is rendered non-operating by the switching component 13. It is to be noted that the switching component 13 may not necessarily be mounted on the second mount board 12 but may be mounted anywhere in the interior of the electronic component device 1C, such as on the first mount board 11.

IV. Fourth Aspect

Figure 10:
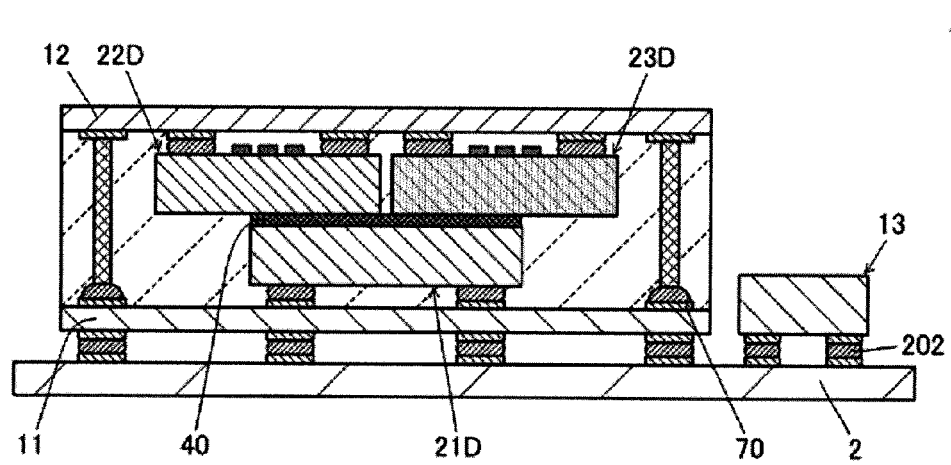
FIG. 10 is a cross-sectional view of an electronic component device according to a fourth aspect of the Example 2, schematically illustrating the structure of the electronic component device, and the positional relationship between the electronic component device and another electronic component device.

FIG. 10 is a cross-sectional view of an electronic component device 1D, illustrating the structure of the electronic component device 1D in which the switching component 13 separate from a first electronic component 21D, a second electronic component 22D, and a third electronic component 23D is located outside the electronic component device having the basic structure according to the above-described preferred embodiment. FIG. 10 also illustrates the positional relationship between the electronic component device 1D and the switching component 13. In FIG. 10, the electronic component device 1D, which includes the first electronic component 21D, the second electronic component 22D, and the third electronic component 23D, and the switching component 13 are mounted over a base circuit board 2 with a connection conductor 202 interposed therebetween. As with the switching component 13 illustrated in FIG. 9, the switching component 13 illustrated in FIG. 10 controls switching of the second and third electronic components 22D and 23D such that one of the two electronic components is rendered operating and the other is rendered non-operating. In this way, switching of the first electronic component 21D, the second electronic component 22D, and the third electronic component 23D may be performed by a component located outside the electronic component device having the basic structure.

In each of the third and fourth aspects described above, the electronic component device further includes the switching component 13, which is an example of a component having a switching function. The switching component 13 switches, between operating and non-operating states, at least one portion of at least one electronic component among the first electronic component 21C or 21D, the second electronic component 22C or 22D, and the third electronic component 23C or 23D.

With the above-described configuration, at least one portion of at least one electronic component among the first electronic component 21C or 21D, the second electronic component 22C or 22D, and the third electronic component 23C or 23D can be switched between operating and non-operating states at desired timing by the switching component 13. As a result, the heat dissipation of the electronic component device can be improved while enabling each electronic component to operate efficiently.

The switching component 13 may switch at least one portion of the first electronic component 21C or 21D between operating and non-operating states.

With the above-described configuration, at least one portion of the first electronic component 21C or 21D can be switched by the switching component 13 between operating and non-operating states, thus making it possible to obtain a state in which at least one portion of the first electronic component 21C or 21D is not operating. In this case, when the at least one portion of the first electronic component 21C or 21D is in a non-operating state, a large temperature difference can be created between the first electronic component 21C or 21D, and each of the second electronic component 22C or 22D and the third electronic component 23C or 23D. The first electronic component 21C or 21D is in contact with the second electronic component 22C or 22D and the third electronic component 23C or 23D. Consequently, as compared with the second electronic component 22C or 22D and the third electronic component 23C or 23D, the first electronic component 21C or 21D has comparatively more chances of becoming a passage point for the heat being dissipated, and conducts comparatively more heat during heat dissipation. Therefore, the above-described configuration further improves the heat dissipation of the electronic component device.

Each of the electronic component devices 1A to 1D according to the first to fourth aspects of preferred embodiments of the present invention includes a switching component that switches the operations of two filter circuit portions. However, the electronic component device according to preferred embodiments of the present invention may not necessarily include such a switching component. The switching component according to preferred embodiments of the present invention may be, for example, a switching component that controls the switching of operating and non-operating states only for one of filter circuit portions incorporated in the first, second, and third electronic components. Alternatively, the switching component may be a switching component that controls switching such that one of the first electronic component, the second electronic component, and the third electronic component is rendered operating, and the other two electronic components are rendered non-operating. With such a switching component as well, it is possible to create a state in which at least one electronic component among the first electronic component, the second electronic component, and the third electronic component that contact or bond with each other is not operating. Therefore, even if the number of objects to be switched changes as described above, the heat dissipation of the electronic component devices according to preferred embodiments of the present invention are able to be effectively improved.

Similarly, although the foregoing description of the first to fourth aspects of preferred embodiments of the present invention is directed to the case where a filter circuit portion is switched between a conducting (operating) and a non-conducting (non-operating) state, a portion other than a filter circuit portion may be switched between a conducting (operating) and a non-conducting (non-operating) state. Some circuit portion or functional portion provided in each electronic component may be switched between a conducting (operating) and a non-conducting (non-operating) state, or each electronic component itself may be switched between operating and non-operating states.

Modifications

Electronic component devices according to various modifications of the preferred embodiments will be described below with references to FIGS. 11A and 11B and FIGS. 12A and 12B. The electronic component devices according to these modifications only partially differ from the electronic component device 1 having the basic structure. Accordingly, the following description will mainly focus only on differences from the electronic component device 1 according to the basic structure, and a description of features similar to those of the electronic component device 1 according to the basic structure will not be repeated. As for reference signs, the following description will use the same reference signs as those used for the electronic component device 1 according to the basic structure.

1. Modification 1

Figure 11A:
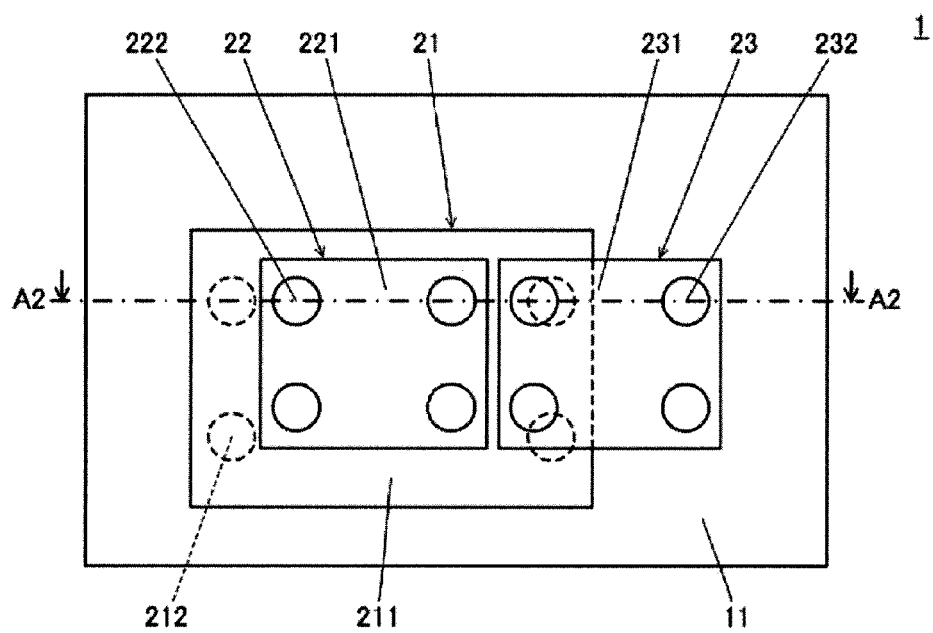
Figure 11B:
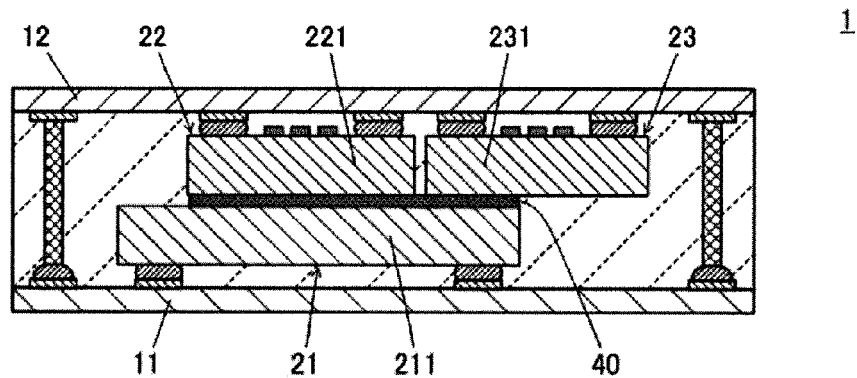

An electronic component device according to a Modification 1 of a preferred embodiment will be described below with reference to FIGS. 11A and 11B. FIGS. 11A and 11B illustrate the structure of the electronic component device 1 according to the Modification 1, of which FIG. 11A is a plan view of the main portion of the electronic component device 1, and FIG. 11B is a cross-sectional view taken along an arrowed line A2-A2 in FIG. 11A.

FIG. 11A is a plan view of the main portion including components such as the first mount board 11, the first electronic component 21, the second electronic component 22, and the third electronic component 23. As illustrated in FIG. 11A, in plan view of the electronic component device 1, the outer periphery of the first base body 211 of the first electronic component 21 is located outside the outer periphery of the second base body 221 of the second electronic component 22. In other words, in plan view, the first base body 211 and the second base body 221 overlap, and the first base body 211 has a larger area than the second base body 221. By contrast, as compared with the outer periphery of the third base body 231 of the third electronic component 23, the outer periphery of the first base body 211 is partially located inside the outer periphery of the third base body 231.

In this case, as illustrated in FIG. 11B, a major surface of the third base body 231 located proximate to the first base body 211 partially does not face the first base body 211. At this time, a major surface of the third base body 231 that does not face the first base body 211 is located at a greater distance from a major surface of the first base body 211 located proximate to the third base body 231 than a major surface of the third base body 231 that faces the first base body 211. In this case, when the third electronic component 23 becomes operating and the third base body 231 generates heat, heat dissipated from a major surface of the third base body 231 not facing the first base body 211 is conducted to the first base body 211 more slowly than heat dissipated from a major surface of the third base body 231 facing the first base body 211. In other words, heat dissipated from a major surface of the third electronic component 23 not facing the first electronic component 21 is less readily conducted to the first electronic component 21 than heat dissipated from a major surface of the third electronic component 23 facing the first electronic component 21. By contrast, if the outer periphery of the second base body 221 in plan view is located inside the outer periphery of the first base body 211 in plan view as described above, a major surface of the second base body 221 located proximate to the first base body 211 faces the first base body 211 in its entirety. In other words, a greater portion of the heat generated in the second electronic component 22 is readily conducted to the first electronic component 21. This increases conduction of heat to the first electronic component 21, which has more chances of becoming a passage point for heat dissipation paths than the second electronic component 22. Consequently, the amount of heat dissipated increases, which improves the heat dissipation of the electronic component device 1.

Heat dissipation of the electronic component device 1 is readily improved also if, conversely to the arrangement in FIG. 11A, the outer periphery of the third base body 231 in plan view is located inside the outer periphery of the first base body 211 in plan view, and the outer periphery of the second base body 221 in plan view is partially located outside the outer periphery of the first base body 211 in plan view. This is because in this case, a greater portion of the heat generated in the third electronic component 23 is readily conducted to the first electronic component 21.

Although, in FIG. 11A, the outer periphery of the second base body 221 in plan view is located inside the outer periphery of the first base body 211 in plan view, the same or substantially the same advantageous effect as described above can be sufficiently obtained even if the outer periphery of the second base body 221 merely overlaps the outer periphery of the first base body 211.

2. Modification 2

Figure 12A:
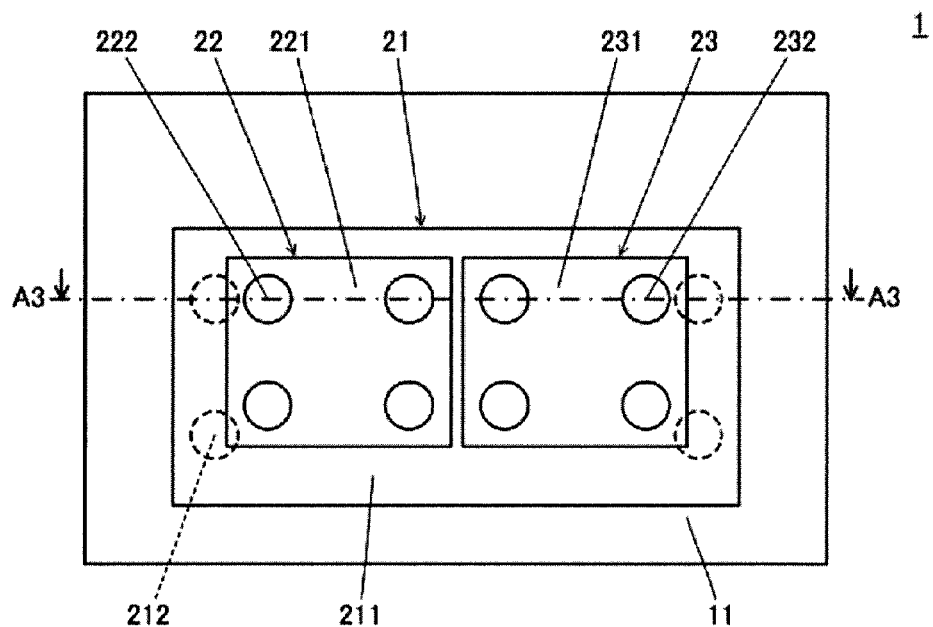
Figure 12B:
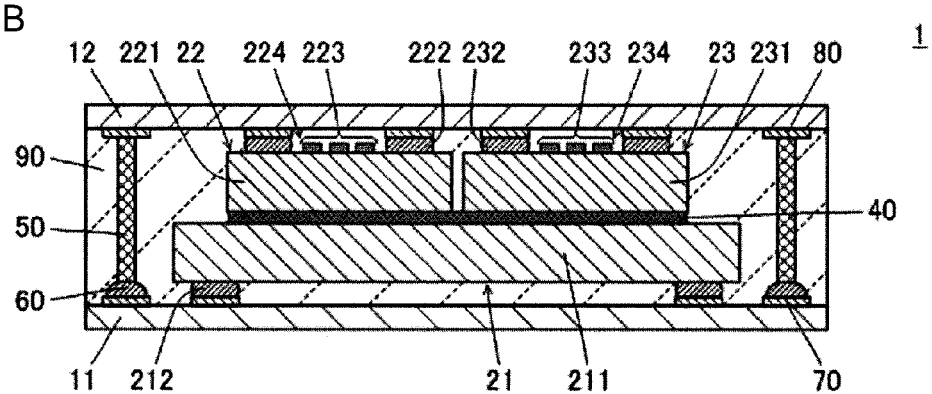

Next, an electronic component device according to a Modification 2 of a preferred embodiment will be described with reference to FIGS. 12A and 12B. FIGS. 12A and 12B illustrate the structure of the electronic component device 1 according to the Modification 2, of which FIG. 12A is a plan view of the main portion of the electronic component device 1, and FIG. 12B is a schematic cross-sectional view taken along an arrowed line A3-A3 in FIG. 12A.

FIG. 12A is a plan view of the main portion including components such as the first mount board 11, the first electronic component 21, the second electronic component 22, and the third electronic component 23. As illustrated in FIG. 12A, in the Modification 2, the outer periphery of the first base body 211 in plan view is located outside the outer periphery of the second base body 221 in plan view and the outer periphery of the third base body 231 in plan view. More specifically, in plan view, the first base body 211 overlaps the second base body 221 and the third base body 231, and the first base body 211 has a larger area than the second base body 221 and the third base body 231.

In this case, as illustrated in FIG. 12B, the respective major surfaces of the second and third base bodies 221 and 231 located proximate to the first base body 211 face the first base body 211 in their entirety. This configuration ensures that a greater portion of the heat generated in each of the second electronic component 22 and the third electronic component 23 is readily conducted to the first electronic component 21. This improves the heat dissipation of the electronic component device 1.

For the electronic component device 1 according to each of the Modification 1 and the Modification 2, with the electronic component device 1 seen in plan view in the direction of thickness of the first electronic component 21, the outer periphery of the first electronic component 21 either overlaps the outer periphery of the electronic component 22 or the outer periphery of the third electronic component 23, or is located outside the outer periphery of the second electronic component 22 or the outer periphery of the third electronic component 23.

In this regard, the first electronic component 21 has more chances of becoming a passage point for the heat being dissipated than the second electronic component 22 and the third electronic component 23. Consequently, with the electronic component device 1 seen in plan view in the direction of thickness of the first electronic component 21, the greater the area of overlap with the first electronic component 21, the greater the heat dissipation of the electronic component device 1. Therefore, the above-described configuration further improves the heat dissipation of the electronic component device 1 in comparison to when, with the electronic component device 1 seen in plan view in the direction of thickness of the first electronic component 21, the outer periphery of the first electronic component 21 is located inside the outer periphery of the second or third electronic component 22 or 23.

Other Features

Various possible features of the electronic component device 1 according to a preferred embodiment of the present invention will be described below with reference to FIGS. 12A and 12B.

First, at least two base bodies among the first base body 211, the second base body 221, and the third base body 231 preferably differ from each other in thermal conductivity. It is particularly preferable if the first base body 211 has a higher thermal conductivity than the second base body 221 and the third base body 231. For example, the electronic component device 1 according to the basic structure described above is preferably made of silicon with a thermal conductivity of approximately 160 (W/m·K), and the second base body 221 and the third base body 231 are preferably made of LN or LT with a thermal conductivity ranging from approximately 2 to 7 (W/m·K), for example.

More heat tends to be conducted through the first electronic component 21 including the first base body 211 than through the second electronic component 22 including the second base body 221 and the third electronic component 23 including the third base body 231. Accordingly, if the first base body 211 has a higher thermal conductivity than the second base body 221 and the third base body 231, the amount of heat dissipated increases, thus enabling improved heat dissipation of the electronic component device 1.

In this regard, the thermal conductivity of a base body that is a multilayer body, and the thermal conductivity of another base body can be compared by comparing, with the thermal conductivity of the other base body, the thermal conductivity of a component having the largest volume among plural components defining the multilayer body.

Preferably, at least one of the first mount board 11 and the second mount board 12 includes a heat dissipation mechanism. The term heat dissipation mechanism as used herein refers to a component that uses refrigerant, such as a heat sink or a heat pipe, or an element made of a material with relatively high thermal conductivity, such as a metallic plate, for example.

If at least one of the two mount boards 11 and 12 is provided with an element capable of further dispersing or moving away the heat that has been conducted to the mount board, heat dissipation improves for the mount board through which to dissipate heat away from the electronic component device. This also leads to improved heat dissipation of the electronic component device 1.

In addition, the area of the first mount board 11 in plan view preferably differs from the area of the second mount board 12 in plan view. It is particularly preferable if the area of the first mount board 11 in plan view is greater than the area of the second mount board 12 in plan view. A mount board with a greater area in plan view tends to disperse more heat. In this regard, more heat tends to be conducted through the first electronic component 21 mounted on the first mount board 11 than through the second and third electronic components 22 and 23 mounted on the second mount board 12. This also means that more heat tends to be conducted through the first mount board 11 on which the first electronic component is mounted, than through the second mount board 12. Therefore, changing the area of the first mount board 11 in plan view as described above significantly increases the heat dissipation through the first mount board 11, which also significantly improves the heat dissipation of the electronic component device 1.

Alternatively, the area of the second mount board 12 in plan view may be greater than the area of the first mount board 11 in plan view. The second mount board 12 dissipates heat away from the electronic component device, in two of the three heat dissipation paths that the electronic components have. Increased heat dissipation through the second mount board 12 increases the heat dissipation capability of the two heat dissipation paths, which in turn helps improve the heat dissipation of the electronic component device 1.

As described above with reference to the basic structure, preferably, the first, second, and third electronic components 21, 22, and 23, a major surface of the first mount board 11 located proximate to the second mount board 12, and a major surface of the second mount board 12 located proximate to the first mount board 11 are sealed with the sealant 90. In this case, heat generated in each of the electronic components 21, 22, and 23 can be dissipated also through the sealant 90.

The bonding layer 40 in this case may be made of, for example, a material including any one of resin, glass, metal, carbon, ceramics, and a mixture thereof. It is particularly preferable to use a material such as metal, carbon, alumina, silicon carbide, or boron nitride, for example. If such a material with comparatively high thermal conductivity is used for the bonding layer 40 that bonds the base bodies or the sealant 90 that covers the base bodies, the speed and amount of heat conduction to the first mount board 11 and the second mount board 12 increase, which improves the heat dissipation capability of each heat dissipation path. This further improves the heat dissipation of the electronic component device 1.

The bonding layer 40 and the sealant 90 may be made of the same material. Using different materials for the bonding layer 40 and the sealant 90 makes it necessary to form the two components individually. By contrast, using the same material for the bonding layer 40 and the sealant 90 enables simultaneous and integral formation of the two components. This configuration can further facilitate the manufacture of the electronic component device 1 according to preferred embodiments.

Further, the sealant 90 is preferably made of a material with a thermal conductivity higher than or equal to the thermal conductivity of the first, second, or third base body 211, 221, or 231. If the sealant 90 has a lower thermal conductivity than all of the first, second, and third base bodies 211, 221, and 231 covered by the sealant 90, most of the heat generated in each electronic component is not conducted to the sealant 90. In other words, not much heat is dissipated through the sealant 90, and thus generated heat tends to become trapped within each electronic component. By contrast, if the sealant 90 has a thermal conductivity higher than or equal to the thermal conductivity of at least one of the first, second, and third base bodies 211, 221, and 231, the amount of heat conducted from each electronic component to the sealant is less likely to decrease, which in turn improves the heat dissipation of the electronic component device 1. One exemplary way to increase the thermal conductivity of the sealant 90 as described above is to add alumina filler to the sealant 90.

Similarly, the bonding layer 40 is preferably made of a material with a thermal conductivity higher than or equal to the thermal conductivity of the first, second, or third base body 211, 221, or 231. This configuration ensures that heat generated in the first electronic component 21, the second electronic component 22, or the third electronic component 23 can be conducted to another electronic component without significantly decreasing in amount. This further improves the heat dissipation of the electronic component device 1.

As the thickness of the bonding layer 40 decreases, so does the distance between two base bodies to be bonded. In this case, heat generated in a given base body is conducted faster to another base body through which the heat passes next in each heat dissipation path after passing through the bonding layer 40, resulting in improved heat dissipation of the electronic component device 1. To reduce the distance between two base bodies to be bonded as described above, the respective outer terminals 212, 222, and 232 of the first, second, and third electronic components 21, 22, and 23 may be increased in height. This configuration makes it possible to obtain the electronic component device 1 that readily enables improved heat dissipation.

Further, the greater the area of contact or bonding between the major surfaces of individual base bodies, the more readily heat generated in a given base body is conducted to another base body through which the heat passes in each heat dissipation path. To increase this area, all of the first base body 211, the second base body 221, and the third base body 231 preferably either contact or bond with each other at their major surface located opposite to the major surface provided with the corresponding outer terminal. The major surface of the base body 211, 221, or 231 located opposite to the major surface provided with the corresponding outer terminal is not provided with the outer terminal 212, 222, or 232. This configuration increases the area of contact or bonding between the respective major surfaces of the base bodies 221, 221, and 231 in comparison to when each base body contacts or bonds with another base body at its major surface provided with the corresponding outer terminal.

Many boards used as mount boards allow for relatively less dispersion of heat, such as printed circuit boards, interposer boards, or flexible boards. Accordingly, preferably, the first base body 211, the second base body 221, and the third base body 231 each have a higher thermal conductivity than the first mount board 11 and the second mount board 12. Each of these base bodies 211, 221, and 231 defines and functions as a point in each heat dissipation path through which heat passes immediately before reaching the first mount board 11 and the second mount board 12. Accordingly, if each of the base bodies 211, 221, and 231 has a higher thermal conductivity than the mount boards 11 and 12, heat generated in each electronic component is dispersed to some extent through each base body immediately before being conducted to the first mount board 11 and the second mount board 12. In other words, even if not much heat is dispersed through the first mount board 11 and the second mount board 12, heat is readily dissipated away from the electronic component device, which in turn improves the heat dissipation of the electronic component device 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component device comprising:
    a first mount board;
    a second mount board facing the first mount board and electrically connected with the first mount board; and
    three or more electronic components disposed between the first mount board and the second mount board;
    wherein
    the three or more electronic components include:
        a first electronic component including a first major surface and a second major surface that face away from each other, the first electronic component being disposed on the first mount board;
        a second electronic component including a third major surface and a fourth major surface that face away from each other, the second electronic component being disposed on the second mount board; and
        a third electronic component including a fifth major surface and a sixth major surface that face away from each other, the third electronic component being disposed on the second mount board;
    the first major surface is positioned closer to the first mount board than the second major surface;
    the third major surface is positioned closer to the second mount board than the fourth major surface;
    the fifth major surface is positioned closer to the second mount board than the sixth major surface;
    the second major surface directly contacts the fourth and sixth major surfaces, or indirectly contacts the fourth and sixth major surfaces with a bonding layer interposed between the second major surface and the fourth and sixth major surfaces; and
    in a direction parallel or substantially parallel to the second major surface, a maximum length of the bonding layer is less than a maximum length of at least one of the first mount board and the second mount board.

2. The electronic component device according to claim 1, wherein
    the first electronic component includes a first base body;
    the second electronic component includes a second base body;
    the third electronic component includes a third base body; and
    at least two base bodies among the first base body, the second base body, and the third base body differ from each other in thermal conductivity.

3. The electronic component device according to claim 2, wherein the first base body has a higher thermal conductivity than the second base body and the third base body.

4. The electronic component device according to claim 1, wherein at least one electronic component among the first electronic component, the second electronic component, and the third electronic component is a semiconductor component.

5. The electronic component device according to claim 1, wherein
    the first electronic component is a semiconductor component; and
    the second electronic component and the third electronic component are acoustic wave components.

6. The electronic component device according to claim 1, wherein at least one electronic component among the first electronic component, the second electronic component, and the third electronic component includes at least one portion that switches between an operating state and a non-operating state.

7. The electronic component device according to claim 1, further comprising:
    a component with a switching function; wherein
    the component with the switching function switches at least one portion of at least one electronic component between an operating state and a non-operating state, the at least one electronic component being at least one of the first electronic component, the second electronic component, and the third electronic component.

8. The electronic component device according to claim 7, wherein the component with the switching function switches at least one portion of the first electronic component between an operating state and a non-operating state.

9. The electronic component device according to claim 7, wherein
    the at least one electronic component switched by the component with the switching function includes a first filter circuit portion, and a second filter circuit portion; and
    the component with the switching function switches the at least one electronic component between a state in which the first filter circuit portion is operating and the second filter circuit portion is not operating, and a state in which the second filter circuit portion is operating and the first filter circuit portion is not operating.

10. The electronic component device according to claim 1, wherein
    the first electronic component is a component with a switching function; and
    the component with the switching function switches at least one portion of at least one electronic component between an operating state and a non-operating state, the at least one electronic component being at least one of the second electronic component and the third electronic component.

11. The electronic component device according to claim 1, wherein in a plan view of the electronic component device seen in a direction of thickness of the first electronic component, an outer periphery of the first electronic component overlaps an outer periphery of the second electronic component or an outer periphery of the third electronic component, or is located outside the outer periphery of the second electronic component or the outer periphery of the third electronic component.

12. The electronic component device according to claim 1, wherein at least one of the first mount board and the second mount board includes a heat dissipation mechanism.

13. The electronic component device according to claim 1, wherein in a plan view of the electronic component device seen in a direction of thickness of the first electronic component, the first mount board differs in area from the second mount board.

14. The electronic component device according to claim 1, further comprising:
a sealant provided between the first mount board and the second mount board; wherein
the sealant seals the three or more electronic components.

15. The electronic component device according to claim 14, wherein the bonding layer is made of a material including one of resin, glass, metal, carbon, ceramics, and a mixture thereof.

16. The electronic component device according to claim 14, wherein the bonding layer and the sealant are made of a same material.

17. The electronic component device according to claim 14, wherein
the first electronic component includes a first base body;
the second electronic component includes a second base body;
the third electronic component includes a third base body; and
the sealant has a thermal conductivity equal or approximately equal to a thermal conductivity of the first base body, the second base body, or the third base body, or has a thermal conductivity higher than the thermal conductivity of the first base body, the second base body, or the third base body.

18. The electronic component device according to claim 1, wherein
the first electronic component includes a first base body; and
the first base body has a higher thermal conductivity than the first mount board.

19. The electronic component device according to claim 1, wherein
the second electronic component includes a second base body;
the third electronic component includes a third base body; and
the second base body or the third base body has a higher thermal conductivity than the second mount board.

* * * * *